(12) United States Patent
McDowell

(10) Patent No.: US 10,739,428 B2
(45) Date of Patent: Aug. 11, 2020

(54) EXTENDED CONTINUOUS PASSIVE SHIMMING OF MAGNETS

(71) Applicant: Andrew F. McDowell, Albuquerque, NM (US)

(72) Inventor: Andrew F. McDowell, Albuquerque, NM (US)

( * ) Notice: Subject to any disclaimer, the term of this patent is extended or adjusted under 35 U.S.C. 154(b) by 682 days.

(21) Appl. No.: 15/488,165

(22) Filed: Apr. 14, 2017

(65) Prior Publication Data

US 2017/0299674 A1 Oct. 19, 2017

Related U.S. Application Data

(60) Provisional application No. 62/324,227, filed on Apr. 18, 2016.

(51) Int. Cl.
*G01R 33/3873* (2006.01)
*G01R 33/38* (2006.01)

(52) U.S. Cl.
CPC ..... *G01R 33/3873* (2013.01); *G01R 33/3802* (2013.01); *G01R 33/3806* (2013.01)

(58) Field of Classification Search
CPC .............. G01R 33/3873; G01R 33/3802; G01R 33/46; G01R 33/4608; G01R 33/4616; G01R 33/4625; G01R 33/4633; G01R 33/4641; G01R 33/465; G01R 33/543; G01R 33/56; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316; G01R 33/56325; G01R 33/56341; G01R 33/5635; G01R 33/56358; G01R 33/56366; G01R 33/56375; G01R 33/56383;

(Continued)

(56) References Cited

U.S. PATENT DOCUMENTS 4,631,481 A † 12/1986 Young
5,045,794 A 9/1991 Dorri et al.

(Continued)

OTHER PUBLICATIONS

Lopez, H.S., et al., Passive Shim Design and a Shimming Approach for Biplanar Permanent Magnetic Resonance Imaging Magnets, 44 IEEE Trans. on Magnetics 394-402 (Mar. 2008) (Year: 2008).*

(Continued)

*Primary Examiner* — Tung X Nguyen
*Assistant Examiner* — Robert P Alejnikov, Jr.
(74) *Attorney, Agent, or Firm* — Rod D. Baker

(57) ABSTRACT

Methods and apparatuses for homogenizing or correcting the magnetic fields of magnets, particularly the magnetic fields employed in nuclear magnetic resonance (NMR) and magnetic resonance imaging (MRI) applications. There are disclosed passive shims for making such homogenizations or corrections, methods for making such shims, and a method and apparatus for creating desirable correction fields in which the correction field strength has limited harmonic content, near continuous value of field strength, and occupies minimal space in the magnet.

46 Claims, 5 Drawing Sheets

(58) Field of Classification Search
CPC ............ G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676
USPC ....................................................... 324/307
See application file for complete search history.

(56) References Cited

U.S. PATENT DOCUMENTS

| | | | | |
|---|---|---|---|---|
| 5,235,284 | A * | 8/1993 | Tahara | G01R 33/3873 324/318 |
| 5,343,183 | A | 8/1994 | Shimada et al. | |
| 5,790,006 | A * | 8/1998 | Abele | G01R 33/3808 335/301 |
| 6,181,137 | B1 * | 1/2001 | Havens | G01R 33/387 324/319 |
| 6,294,972 | B1 * | 9/2001 | Jesmanowicz | G01R 33/3873 324/318 |
| 6,313,634 | B1 * | 11/2001 | Kasten | G01R 33/3873 324/309 |
| 7,365,540 | B2 * | 4/2008 | Westphal | G01R 33/3815 324/318 |
| 7,405,567 | B2 | 7/2008 | McDowell | |
| 9,285,441 | B1 | 3/2016 | McDowell | |
| 2008/0054902 | A1 * | 3/2008 | Juchem | G01R 33/3873 324/320 |
| 2011/0137589 | A1 * | 6/2011 | Leskowitz | G01R 33/3875 702/57 |
| 2011/0304220 | A1 * | 12/2011 | Whitehead | H02J 50/12 307/104 |
| 2013/0249559 | A1 * | 9/2013 | Biber | A61B 5/055 324/322 |
| 2015/0061680 | A1 * | 3/2015 | Leskowitz | H01F 7/0273 324/322 |
| 2015/0323627 | A1 * | 11/2015 | Mallet | G01R 33/387 335/302 |
| 2016/0087514 | A1 * | 3/2016 | Saint-Michel | H02K 19/103 310/114 |

OTHER PUBLICATIONS

Jesmanowicz, A., et al., Local Ferroshims Using Office Copier Toner, 9 Proc. Intl. Soc. Mag. Reson. Med. 617 (Jan. 2001) (Year: 2001).*

Anderson, W.A., "Electrical Current Shims for Correcting Magnetic Fields", The Review of Scientific Instruments, Mar. 1961, vol. 32, No. 3, USA.

Written Opinion prepared on PCT/US2017/028014 prepared by the USPTO acting as International Search Authority and dated Aug. 30, 2017. PCT/US2017/028014 being filed in the name of Nuevomor, LLC with Andrew F. McDowell named as inventor and claiming priority to this application (U.S. Appl. No. 15/488165) and the earlier corresponding US provisional application (U.S. Appl. No. 61/324,227) and having corresponding claims to this application.†

Title: Local ferroshims using office copier toner; Author: Jesmanowicz, A., Roopchansingh, V., Cow, R., Starewicz, P., Punchard, W., & Hyde, J.; Published in: Proceedings of the International Society of Magnetic Resonance in Medicine; Publisher: Unknown; Location Published: Unknown; Pages Submitted: Entire article; Publication Date: 2001.†

Title: Passive Shim Design and a Shimming Approach for Biplanar Permanent; Author: Lopez, H.S., Liu, F., Weber, E., & Stuart, C.; Published in: IEEE Transactions on Magnetics; Publisher: Unknown; Location Published: Unknown; Pages Submitted: Entire article; Publication Date: Mar. 2008.†

\* cited by examiner
† cited by third party

EXTENDED CONTINUOUS PASSIVE SHIMMING OF MAGNETS

CROSS REFERENCE TO RELATED APPLICATION

This application claims the benefit of, and priority to, U.S. Provisional Patent Application Ser. No. 62/324,227 filed 18 Apr. 2016, entitled "Extended Continuous Passive Shimming of Magnets," and the entire disclosure thereof is incorporated herein by reference.

FIELD OF THE INVENTION

This invention relates generally to methods and apparatuses for homogenizing or correcting the magnetic fields of magnets, particularly the magnetic fields employed in nuclear magnetic resonance (NMR) and magnetic resonance imaging (MRI) applications, and more particularly to passive shims for making such homogenizations or corrections, and specifically to a method and apparatus for creating desirable correction fields in which the correction field strength has limited harmonic content, near continuous value of field strength, and occupies minimal space in the magnet.

BACKGROUND OF THE INVENTION

Strong, uniform magnetic fields are desirable in many situations. Examples include scientific instruments, devices for measuring important industrial parameters, apparatus for achieving certain effects on samples or materials, devices for education or student experimentation in instructional settings, and many others. Often, a device or phenomenon that relies on or incorporates a magnetic field in its operation will be improved if the field is more uniform in strength. Such improvements may be an increase in speed, efficiency, precision, resolution, stability, sensitivity, or other feature or the device, measurement, or process. A more uniform magnetic field may also allow the use of smaller, weaker, and/or less expensive magnets to achieve a desired goal.

In other cases, improvements in device performance may result from a magnetic field having a particular non-uniform field strength distribution throughout a region of space. Often, and in particular for the present disclosure, methods for homogenizing magnetic fields can also be used to accurately achieve particular non-uniform target field distributions.

Many methods for homogenizing or correcting the magnetic field of magnets have been developed. Mechanical methods, including precise design and shaping of the magnet's pieces, attention to accurate positioning during the assembly of the magnet, careful selection of uniform and/or matched pieces of permanent magnetic material, and careful adjustment of the relative positions of the magnet pieces after initial assembly, have been used. Post-assembly mechanical adjustments, including screws to move some or all of the positions of the magnet's constituent pieces, movement of magnet pieces or other structures that control the distribution of magnetic flux lines in space, and large-scale distortions of the magnet structure are all examples of mechanical methods for improving the field homogeneity of magnets. This list of mechanical methods is not exhaustive. For example, magnets may be disassembled and then reassembled with new thin pieces or "shims" incorporated so that the relative positions of the magnet's constituents are altered, changing the shape of the magnetic field. Other examples of past efforts to adjust, with mechanical shimming, a magnetic field include U.S. Pat. No. 4,631,481 to Young et al., U.S. Pat. No. 5,235,284 to Tahara et al., U.S. Pat. No. 5,343,183 to Shimada et al., and U.S. Pat. No. 6,313,634 to Kasten.

Of present relevance are techniques generally known as "passive shimming," in which additions of extra pieces of material on the surface of or in the interior and/or exterior of the magnet are used to change the magnetic field in a manner that does not require electrical current. Passive shimming is frequently achieved through the careful placement of small pieces (known as "buttons") of highly magnetizeable materials (low-carbon steel, nickel, or similarly magnetically responsive materials) or of permanent magnet materials such as neodymium-iron-boron, samarium-cobalt, or other like materials known in the art. The buttons are discrete pieces of various sizes, and the locations, orientation, sizes, and number of buttons needed to correct the field are determined through the use of magnetic field measurements, magnetic field calculations or simulations, or combinations of these and other techniques well known in the art (see, as an example, U.S. Pat. No. 5,045,794 to Dorri). The buttons are typically much smaller than the size scale of the magnet, its gap, and the working volume over which field correction is desired.

Non-mechanical methods are likewise possible. The non-mechanical methods often have the attractive characteristic of continuous adjustability, ease of adjustment, and ease of automation. One common non-mechanical method utilizes wires that carry electrical current. Such currents create magnetic fields in the region of space around the wires. These fields are strongest near the wires and have a spatial distribution of strength and orientation. By carefully selecting the locations and adjusting the currents in such wires, the magnetic field can be made more homogeneous because the magnetic fields due to the currents can counteract some or all of the nonhomogeneities present in the field of the original magnet. By analogy with the thin sheets or strips of metal (e.g., shim stock) that have sometimes been used to mechanically adjust magnets, the coils of wire have come to be known as "shims" or "shim coils." Various methods known in the art may be used to optimize the positions of the wires. Further methods known in the art may be used to optimize the current values in each shim coil in order to achieve the desired field correction, a process referred to as "shimming the magnet."

Non-mechanical methods may be used in conjunction with one or more of the mechanical methods. Mechanical adjustments are often preferred for making large corrections, since these can be made without requiring large electrical currents which may be detrimental to the magnet performance. On the other hand, non-mechanical adjustments are often preferred for fine correction of the residual field defects because currents can be adjusted in a continuous manner to achieve the required fine adjustment.

SUMMARY OF THE INVENTION

The presently disclosed apparatus and method combines the advantageous features of both non-mechanical and mechanical methods for field correction. There are disclosed herein innovative designs, materials, and production methods for passive shims. As disclosed herein, the passive shims are produced in a way that creates correction fields that can have nearly continuously-valued field strength, so that errors in the original field can be corrected with high fidelity. Further, as disclosed herein, the passive shims are designed and constructed in a manner that utilizes spatially extended structures in lieu of buttons, which reduces the creation of spurious "high-order" fields (fields that vary rapidly with respect to spatial location), which are a common problem with existing passive shimming technologies. The materials and methods disclosed herein also are advantageous in that they may be very thin and thereby preserve the working space inside the magnets. This may allow the passive shimming of magnets that are too small to be passively shimmed by conventional methods and materials.

The disclosed passive shim design may also be useful in cases where space inside the magnet is not limited. It may be used for magnets made from permanent magnet technology, superconducting magnet technology, electromagnet technology or other magnet technologies. It may be useful in magnets with planar or cylindrical or hybrid geometries, and with magnets possessing any orientation of their magnetic field with respect to the magnet body itself. It may be useful for magnets that are designed to create a particular form of field distribution rather than a uniform field. It may be used with unilateral or single-sided magnets.

The passive shim systems and processes disclosed herein combine the best properties of active and passive shimming approaches. Like traditional passive shims, the present systems can be used without the need for sources of electrical current or other "active" apparatus, so that the inventive methods and apparatus can require no power and the overall device containing the magnet does not require high-precision active shim control apparatus, which may be complicated or bulky. Like traditional active shims, the present system and method can create fields of a strength that may be selected from a continuous or nearly continuous set of values, so that the correction field may be well-matched to any desired field correction. The present apparatus and method has advantages over existing button shimming techniques, in that it uses spatially extended structures rather than discrete, localized buttons.

The linear extent of the spatial structures of the methods and system disclosed here is typically larger than the linear size of the volume of space over which the correction is to be achieved. This reduces or eliminates the production of high-order error fields (fields that vary rapidly as a function of spatial location) that are present when the source of the correction field is a localized point source (e.g., the buttons). The methods disclosed herein also are preferred over traditional passive shim production methods in that the new methods are extremely fast and easily automated. This reduces the expense of production, enables rapid prototyping and iterative correction, and may also reduce the need for sophisticated computation of magnetic fields. The ease of production may also enable the adjustment or repair of magnets in the field, after they have been sited away from the magnet production facility. Ease of passive shim production may also allow for rapid adaptation of the same fundamental methods to new circumstances. As disclosed herein, the passive shims may be produced using readily available, ordinary materials and tools, further reducing costs when compared to traditional passive shimming methods. The ability to design and produce the herein disclosed passive shims rapidly can eliminate the need for accurate calculations of magnetic fields produced by passive shim buttons. This is advantageous when correcting the field of magnets with pole pieces, as the accuracy of these calculations is often not high enough to achieve very high precision corrections, due to the interfering effects of pole magnetization response (e.g., image currents, etc.), as is known in the art.

The approach to passive shimming disclosed herein may be used to produce fields corresponding to functions of "high-order," that is, functions of spatial coordinates raised to the power of three, four, five, or higher. Traditional passive shims methods may lack the fine control over the passive shim strength, and the ability to rapidly iterate to refine the structures, that are required to produce pure high-order fields.

The shims disclosed herein also offer particular advantages for the correction of small magnets, those with a gap between their poles of 20 mm or less, as well as magnets of any size in which the space available for the passive shim structure is limited. The materials used, for example in the preferred embodiment, are extremely thin (typically less than 0.5 mm in thickness, and often much thinner). Hence, these shims can be installed in magnets without compromising the space available for other elements of the apparatus, whereas traditional buttons, being discrete pieces of material that are handled individually, typically required more space. An additional advantage is that the shim materials and production methods disclosed here can produce shims with very weak fields. For small magnets, traditional buttons (which have a minimum size and must be placed close to the region of space in which the field correction is being carried out) create fields that are much stronger than desired, leading to severe demands on controlling their locations and placing an unattainably high requirement for accuracy in the field calculations used to design the traditional button shim layout.

BRIEF DESCRIPTION OF THE SEVERAL VIEWS OF THE DRAWING

In the drawings:

FIG. 3B shows a set of eight D-shapes having a common value of but with different orientations in the plane (in this example eight orientations that are in increments or steps of 45°);

DETAILED DESCRIPTION OF PREFERRED EMBODIMENTS

Figure 1A:
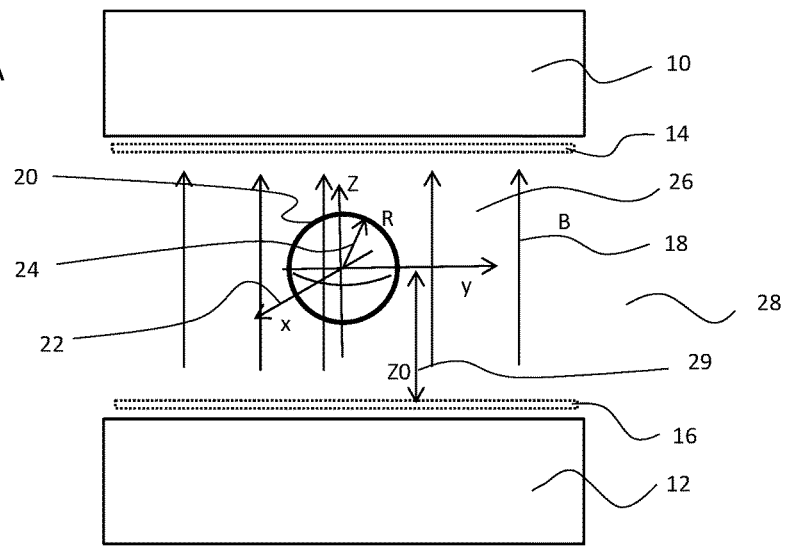
FIG. 1A is a diagrammatic side view of a dipole magnet arrangement having a north magnetic pole and a south magnetic pole that define two parallel surfaces facing each other across a gap, as usable with the present invention.

To understand the concepts and methods disclosed herein, it is helpful to consider some geometrical definitions. FIG. 1 shows some typical magnet geometries and associated mathematical coordinate systems and volumes of space over which the magnetic field is to be corrected. FIG. 1A shows a typical dipole magnet, which is a common format for magnets built with electromagnetic or permanent magnet technologies. This configuration has a north magnetic pole 10 and a south magnetic pole 12 that define two parallel surfaces facing each other across a gap. The poles are often circular or axially symmetric in general shape; in FIG. 1A they are shown from the side. The magnetic field B 18 points from one pole to the other and is nominally uniform throughout the gap. The coordinate system 22 for this type of magnet is conveniently positioned with its origin at the geometrical center of the gap space and its Z-axis lying along the direction of the magnetic field. The direction of the X and Y axes in the plane perpendicular to the magnetic field may be chosen arbitrarily. The working volume of the magnet, over which the field will be corrected, lies somewhere in the gap. The working volume may be spherical, ellipsoidal, cylindrical, cubic, or other shape as required to achieve the design goals of the magnet. The working volume may be positioned at the center of the gap or closer to one pole or the other, or one edge or the other of the poles. A common working volume choice is a sphere 20 of radius R 24 centered in the gap region. The passive shims for a dipole magnet are commonly placed in two planar regions 14, 16, located near either pole. Other locations are also possible for passive shims, such as planes closer to the working volume than the poles, planes or non-planar structures located at other locations in the gap (e.g., in the regions to the sides 26 of the working volume 20), or in locations outside of the magnet gap 28.

Figure 1B:
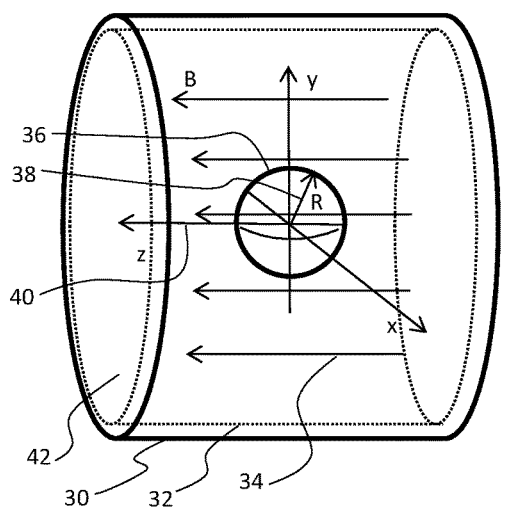
FIG. 1B is a diagrammatic side view of a cylindrical magnet geometry with an axial magnetic field, illustrative of magnets built with superconducting magnet technology, as usable with the present invention.

FIG. 1B depicts a cylindrical magnet geometry 30 with an axial magnetic field 34, as is typical of magnets built with superconducting magnet technology. The magnetic field is largely parallel to the axis of the cylinder and is nominally uniform inside the cylinder. The coordinate system 40 is conveniently chosen with its origin in the center of the cylindrical volume, and its Z axis in the direction of the field. The X and Y directions in the X-Y plane may be chosen arbitrarily. The working volume may be taken to be any region of space in the cylinder, with variations similar to those described above for FIG. 1A. FIG. 1B depicts a common choice for working volume: a sphere 36 of radius R 38 centered in the cylinder defined by the magnet. The passive shims for this magnet geometry are conventionally placed on a cylindrical surface 32 placed inside and close to the inner surface of the cylinder 30 defined by the magnet. Other locations for passive shims are possible, including planar regions near the cylindrical surface of the magnet, planar regions 42 orientated perpendicular to the magnetic field, or other volumes or regions inside or outside of the cylinder defined by the magnet.

Figure 1C:
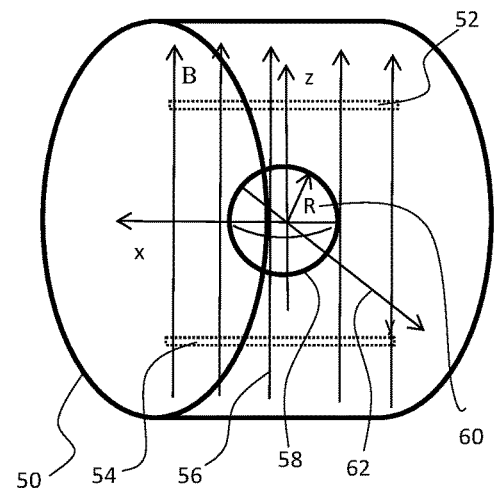
FIG. 1C is a diagrammatic side view of a cylindrical magnet geometry with a transverse field, for magnets built following generally the known design principles of Halbach, and usable with the present invention.

FIG. 1C shows a cylindrical magnet geometry 50 with a transverse field 56, as is common for magnets built following generally the known design principles of Halbach. In such magnets, the field is oriented parallel to the diameter of the cylinder and is nominally uniform within the cylinder defined by the magnet structure 50. A convenient coordinate system 62 for this situation has its origin located at the center of the cylinder and its Z axis pointing in the direction of the field. The direction of the X and Y axes may be chosen arbitrarily in the plane perpendicular to Z. As for the magnet geometries already discussed, the working volume over which the field will be corrected may be any volume or region within the nominally uniform field region. FIG. 1C depicts a common choice for working volume, a sphere 58 of radius R 60 centered in the cylinder defined by the magnet structure. The passive shims for this magnet geometry may be placed on planar regions 52, 54 oriented perpendicular to the magnetic field and sized to fit within the cylinder. Alternatively, the passive shims may be placed on a cylindrical surface positioned inside the cylinder defined by the magnet. The passive shim materials may also be placed on surfaces or volumes of any shape placed at any location inside or outside the cylinder defined by the magnet structure.

The passive shim systems disclosed herein may also be applied to other magnet geometries not depicted in FIG. 1, for example single-sided or "inside-out" magnets. For any such magnet geometry, a working volume may be defined, with a location and a size parameter denoting its linear dimension (equivalent to the radius of the spheres 20, 36, 58). For example, the radius of the minimal sphere that encloses the non-spherical working volume may be taken as a definition of its size. Also, a mathematical coordinate system may be defined and a location for placement of passive shim materials may be specified.

In the disclosure that follows, the discussion will largely center on the dipole magnet geometry of FIG. 1A. This is entirely for convenience and mathematical simplicity. The generalization of the methods and devices disclosed herein to magnets of other geometry assume an understanding of the mathematics, the properties of magnetic fields, and magnetic field correction methods that is to be expected for one of ordinary skill in the art.

Figure 2A:
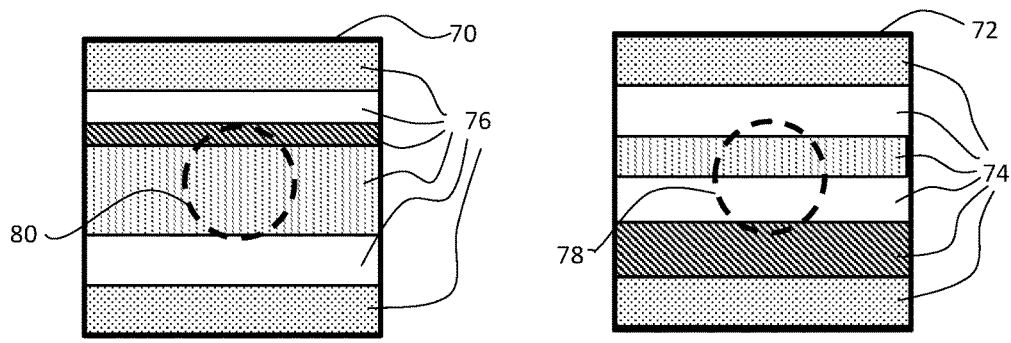
FIG. 2A is a view of two planar substrates according to one embodiment of the present invention, as usable in a dipole magnet configuration with planar passive shims (as seen for example in FIG. 1A), with the planes depicted so to show the patterns of passive shim material, and where the shim elements are extended bars of constant dipole moment density.

For the dipole magnet configuration with planar passive shims, as depicted in FIG. 1A, the passive shim materials are typically arranged in a region within the planes 14, 16, for example, by being attached to a planar substrate or to the magnet pole itself. An example of two planar substrates 70, 72 (locatable respectively in the planes 14, 16) is depicted in FIG. 2A, where the planes are viewed so as to show the patterns of passive shim material. The shim substrate materials used, for example in the preferred embodiment, are thin (e.g., less than 0.5 mm in thickness, and often much thinner). These planes are shown edge-on 14, 16 in FIG. 1A, some distance Z0 29 from the center of the working volume. Passive shims may be thought of as having a distribution of magnetic dipole moment density through their volume. The meaning and calculation of "dipole moment density" is within the knowledge of a person skilled in the art. This dipole moment density creates the magnetic field that will correct the main field (generated by the magnet poles) in the working volume. The correction will be successful when the dipole moment density has the correct distribution on or throughout the passive shim structure. In FIG. 2A, the planar structures are shown with hatched pattern 74, 76, which pattern density is meant to depict the dipole moment density of the structure, darker regions having more dipole moment per unit area than lighter regions. The dashed circles 78, 80, 84, 88, 92, 96, 100, 108 in each of FIGS. 2A-2G represent the size of the working volume 20 over which the field is to be corrected.

Figure 2B:
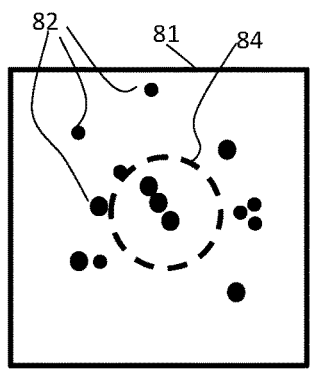
FIG. 2B illustrates a planar example of a technique of passive shimming with "buttons," wherein the dark dots depict the buttons, and with their sizes indicating the different dipole moments for each button.

FIG. 2B depicts a planar 81 example of the prior art technique of passive shimming with buttons. The dark dots 82 illustrate the buttons, with their sizes indicating the different dipole moments for each button. In the prior art, these buttons are either pieces of soft magnetic material of various sizes or number, or pieces of hard magnetic materials of various sizes, number, or orientation. The buttons are all significantly smaller in diameter than the working volume 84. For this reason, prior art techniques for designing the proper button layout to successfully correct the magnetic field typically consider the buttons as point-dipoles (point sources of magnetic field). Prior art techniques may also be limited in the locations allowed for button placement, for example to locations on an otherwise sparsely covered grid. There is typically a large fraction of the surface not covered by button material, so that the distances between buttons are comparable to or larger than their diameters. A further limitation of the prior art technique is that different strengths of point-dipole available may be limited to a set of 10 or 20 dipole strength values. A further limitation is that the minimal point-dipole moment strength may be large when compared to the size of the adjustments needed in the working volume.

Figure 2C:
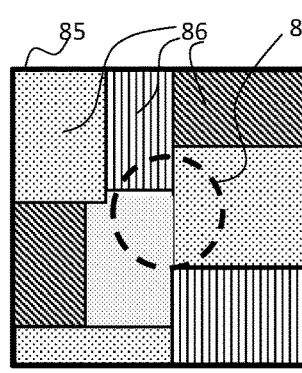
FIG. 2C depicts a possible shim configuration according to the present invention, wherein rather than localized buttons, the shim structure includes a plurality of broad, contiguous, regions of piece-wise constant dipole moment density.

FIG. 2C is a simple depiction of an example of a shim configuration according to the present disclosure. Rather than localized buttons, FIG. 2C shows that the shim structure 85 has a plurality of broad, contiguous, regions 86 of piece-wise constant dipole moment density. As discussed below, the design principles of the present disclosure are based on extended structures whose linear size is comparable to, or larger than, the size of the working volume 88. The depiction in FIG. 2C captures this aspect of the present system and method by showing a planar passive shim structure 85, with contiguous piece-wise constant regions, (typically, but not exclusively, having sizes and shapes that differ between regions), whose size is larger than the radius of the working volume.

The system and method disclosed herein may be considered a process of building up passive shim structures through the layering of passive shim materials of large lateral extent. In the design process, large scale structures are the element of analysis, rather than the point-dipole buttons. In this context, "large" means comparable to (approximately the same as), or larger than, the size of the corresponding working volume. Specifically, the elements of the present shim design all have a maximal lateral extent (that is, linear dimension) that exceeds the radius of the working volume. In many cases, it is advantageous for the lateral extent of the passive shim elements to exceed the diameter of the sphere that fully encloses the working volume. Examples of such extended elements are given in FIG. 2A, where shim elements that are extended bars 74, 76 of constant dipole moment density are shown, FIG. 2D, where an element being a large rectangular block 90 of constant dipole moment is shown, and in FIGS. 2E and 2F where D-shaped region 94 and irregularly shaped region 98 respectively are elements shown. In all of these examples, the shim elements are shown on or in planar structures 89, 93, 97. The sizes of the basic shim elements (74, 76, 86, 90, 98) are shown as exceeding the diameter of the associated working volume 92, 96, 100. Any shape of basic shim element that is at least equal in size to the working volume, and in particular has a maximal linear dimension that exceeds the radius of the working volume, is an aspect of the present system and method.

Figure 2D:
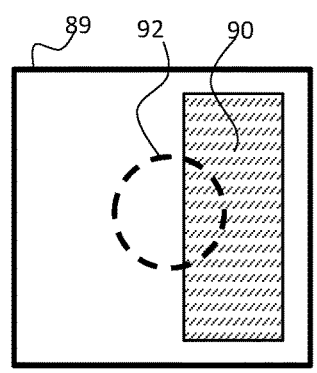
FIG. 2D illustrates extended shim elements similar to those seen in FIG. 2A, but where a shim element is a large rectangular block of constant dipole moment.
Figure 2E:
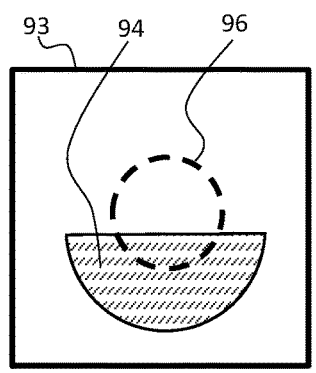
FIGS. 2E and 2F illustrate shim elements somewhat similar to those seen in FIG. 2D, where shim elements define a D-shaped region and an irregularly shaped region, respectively.
Figure 2F:
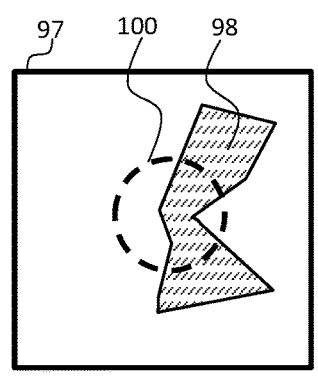
Figure 2G:
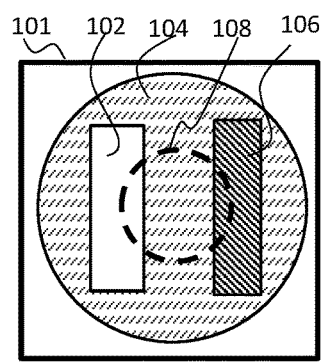
FIG. 2G illustrates yet another alternative embodiment of the present system and method, in which the shim elements pattern in the plane contains three regions of constant dipole moment density, of three different values.

FIG. 2G shows an alternative version of the present system and method. In this case, the elements pattern in plane 101 contains three regions 102, 104, 106 of constant dipole moment density, of three different values. The regions are all large scale, as compared to the working volume size 108. The arrangement or pattern of the regions, and the values of the dipole moment density, may be chosen by design to create a correction field of a particular mathematical form, such as a linear gradient.

The large extent of the shim elements in the systems and methods hereby disclosed offers an important advantage over the prior art. The extended patterns of dipole moment density create relatively smoothly varying and mathematically simple magnetic fields throughout the working volume. The buttons of the prior art, as point sources, create more complicated fields and tend to introduce fields that vary rapidly as a function of location in the working volumes. These rapidly varying fields, known mathematically as "high-order terms," must be managed by cancellation from the various button sources. This in turn requires a high degree of uniformity in the buttons, high accuracy in the design calculations, and extreme control of button placement. The disclosed extended patterns of the shim elements avoid the creation of these troublesome high-order fields, thus avoiding the mentioned difficulties.

For magnet geometries other than the dipole geometry being discussed, for example the geometries depicted in FIGS. 1B and 1C, the concept of large extent of the passive shim elements is clear to those of ordinary skill in the art. For example, for the superconducting geometry of FIG. 1B, the passive shim elements may be large areas of constant dipole moment density spread out on the surface 32 of the cylindrical shim support structure or region. Again, our definition of "large" is a linear dimension comparable to, or greater than, the size of the working volume; for example large compared to the radius R 38 of the sphere 36 that encloses the working volume.

The presently disclosed systems and methods also offer advantages with respect to enabling the use of particularly appropriate materials for the construction of the passive shims. The most desirable materials for use in the present systems are readily formed or deposited into the large-scale patterns described above, or layers of such patterns. It is helpful if the materials have an appropriate magnetic strength and are easy to obtain. One such material is magnetic ink, such as that used in standard MICR (Magnetic Ink Character Recognition) systems used by financial institutions. Such ink is readily available, can be printed with adequate spatial accuracy by inexpensive consumer-style ink-jet printers (or laser printers, etc.), and has well-controlled magnetic properties. Patterns for printing can be rendered as a gray-scale image, giving a nearly continuous intensity scale. A key advantage is the ability to create magnetic dipole densities that may have a strength value that may be selected from a nearly-continuous set of values (for example, from the 256 values of an 8-bit gray scale), rather from the 10 to 20 values available from a typical set of shim buttons. It is understood, therefore, that "nearly continuous" refers to the fine incrementalism accessible from an extended range or scale of values. This ability allows much more accurate correction of magnetic fields than was possible in the prior art.

Alternatively, it may be advantageous to use a specialty printer with direct computer control of the deposition process, so that the shim constructor may control exactly the amount of magnetic ink or other magnetic substance that is deposited in each location throughout the passive shim structure. In this case, the range of dipole moment density values and the number of such values will be limited only by the size and number of minimal depositions that the ink jet, or extruder nozzle, or other deposition device allows.

Another continuous medium for passive shim production can be provided by materials patterned in a 3D printer (additive manufacturing). The material could be metal powder, metal-filled polymer, or other material used in a 3D printer. The same methods may be used to create 2D structures, when planar corrective structures are desired.

There are many other possible materials for use with the present invention. Tapes or foils made from or containing materials with high magnetic susceptibility, such as steel shim stock or foil, nickel shim stock or foil, or other metal or alloy foils, or tapes with imbedded materials such as nickel-particle infused Teflon® tape (e.g., for sealing extreme-service pipe joints), or other tapes bearing magnetically active materials, may be used. Such shims, foils, or tapes may be cut with lasers, water jets, shears, punches or other methods. Quasi-continuous magnetic strength can be achieved by layering.

A continuous-valued material, such as magnetic ink, may be combined with a less-continuous material, such as shim stock. In contrast to a continuous-valued material, a less-continuous material creates a dipole moment density that may have a strength value that may be selected from a discontinuous set of values, for example, from the small set of commercially available thicknesses of shim stock. Corrective plates can be cut from shim stock, or thicker material, to achieve a rough correction, and then the magnetic ink may be added to make the final fine correction. In cases where the available thickness of the solid materials does not match well to the desired strengths of the magnetic fields to be produced, the solid materials may be modified. One such modification may be to change the thickness of the material, by machining or etching, for example. Another modification may be to drill, etch, or cut a pattern of holes in the material, where the hole positions and sizes are selected to remove an amount of material appropriate for the reduction of the produced field. The pattern and sizes of the holes may also be varied across the surface of the material in such a way that the field produced by the modified solid plate creates a magnetic field of a useful shape. The combination of basic passive shim elements, therefore, may be formed from a solid structure modified to achieve the dipole moment density distribution that corrects the magnetic field.

The substrates for the passive shim material can be any material. A simple substrate for magnetic ink is standard printer paper. The patterns may be printed onto the paper, which can then be mounted in position on a suitable shim support structure which is then mounted in the magnet to achieve the desired correction. Extra thin or extra thick paper may be used, as may materials such vellum, plastic, rice paper, onion-skin paper, plastic- or paper-based sticker or adhesive label materials. Such substrates may be held in place by tapes (such as standard Scotch® tape, kapton tape, or similar) or adhesives, such a cyano-acryllic glues, "super-glues", epoxies, UV-cured glues, or the like. Fasteners, such as threaded screws or pins, may be used to secure the passive shims in the magnet structure. The shims may be attached to the magnet itself, at the poles or at the magnet body, or may be attached to a structure that is then mounted in the magnet. Alternatively, the shims may be produced directly onto a surface of a structure of the apparatus that has a separate function and will be mounted in the magnet. One example would be to print the shim patterns directly on the outer surface of an NMR probe structure.

As an alternative, the passive shim structure may be constructed from permanent magnet material. The magnet material may be, for example, a printable ink or polymer or other carrier containing fine particles of rare-earth magnetic materials. If printed with a particular magnetic field direction present, a uniformly magnetized layer of passive shim material may be produced. Subsequent layers may be printed to have different orientations of magnetization, allowing both positive and negative field modifications.

Passive shims including large area regions of piece-wise constant dipole moment, whose constant values may take on a nearly continuous distribution, promote simpler and more robust design methods. By contrast, the prior art of button shimming requires accurate calculation of the fields of the point dipole sources, and the corresponding design process may fail under conditions where the calculations are insufficiently accurate (such as in dipole magnets with very strong fields). Furthermore, the number of button locations required in the traditional shim structure may be quite large, which poses challenges for the software used to determine the optimal button locations and sizes. Finally, the small number of discrete button strengths available for use in any given configuration means that additional errors set by the limited set of strengths of the button fields may degrade the quality of the field correction that is actually achieved.

The design method described below is one preferred approach that takes advantage of the features of the newly disclosed passive shimming method. Other design methods are possible in addition to the one described below. It is possible to realize the advantages of large-scale, continuous-valued passive shimming by using D-shaped patterns such as that depicted in FIG. 2E. The D-shape, i.e., a passive shim defining the shape of a capital letter "D," is only a particular example of using patterns of large lateral extent to formulate passive shims; other examples are shown in FIGS. 2D and 2F, although it will be appreciated that any extended pattern fits within the scope of the disclosed invention.

Figure 3A:
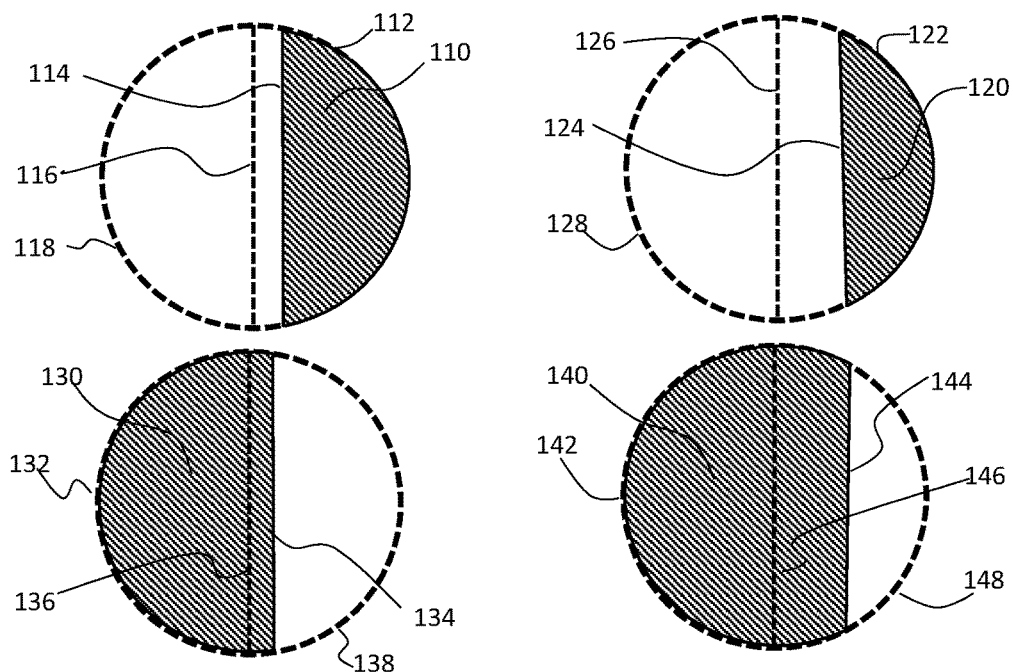
FIG. 3A depicts set of four passive shim elements according to the present system and method, the elements in the form of D-shapes which may be selected for use in shimming a magnet; as shown, the curved edge of each of the D-shapes may be in the shape of a portion of a circular circumference where the circle has the same diameter for all D-shapes.

A set of basic passive shim elements in the form of D-shapes may be selected for use in shimming a magnet. In one example, as depicted in FIG. 3A, the curved edge 112, 122, 132, 142 of each of the D-shapes 110, 120, 130, 140 may be in the shape of a portion of a circular circumference 118, 128, 138, 148 where the circle has the same diameter for all D-shapes. As indicated by FIG. 2E, the circle 118 defining the curved outer edge of the D-shape 110 is larger than the circle 96 corresponding to the linear size of the working volume 20 over which the field is to be corrected. The D-shapes differ from one another in the distance of their straight edge 114, 124, 134, 144 from the center 116, 126, 136, 146 of the circle. This distance (from the center to the straight edge) may be denoted by the symbol η, the value of which is positive if the pattern is smaller than half the circle and negative if the pattern is larger than half the circle. The set of D-shaped basic shim elements to be used for passive shimming may contain shapes described by a plurality of values of η: η1, η2, η3, η4, and so on. It may be convenient to choose the set of D-shapes so that it contains pairs of patterns that share η values of equal magnitude but opposite algebraic sign, but this is not an essential requirement of the disclosed passive shimming technique.

Figure 3B:
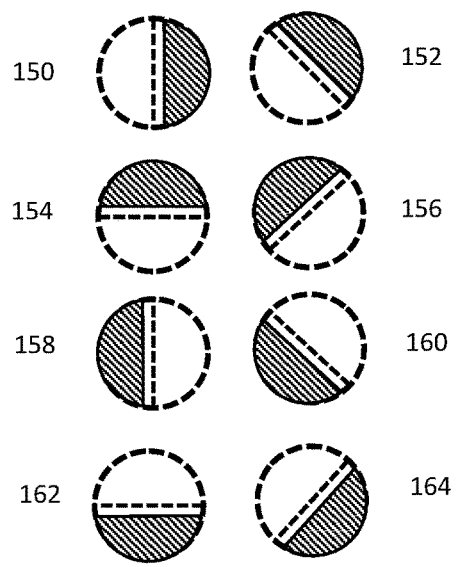
FIG. 3B illustrates yet another alternative embodiment of the present system and method, showing a set of D-shaped passive shim elements to be used to shim a magnet may also contain D-shapes that share the same value but that differ in their orientation.

The set of D-shaped basic passive shim elements to be used to shim a magnet may also contain D-shapes that share the same η value but that differ in their orientation. As an example, FIG. 3B shows a set of eight D-shapes 150, 152, 154, 156, 158, 160, 162, 164, that have a common value of η but have different orientations in the plane, in this example eight orientations that are in increments or steps of 45°. The set of D-shaped basic passive shim elements may contain other numbers of unique orientations, and these orientations need not be uniformly arranged in common angular increments. The D-shapes of different η value need not share a common set of orientations.

The outer radius of the D may be any value, but it advantageous to have the outer curved edge of the D-shape lie further from the working volume than the straight side or edge of the D-shape.

The set of D-shaped basic passive shim elements to be used in shimming a magnet may also contain D-shapes that are oriented so that the side having the passive shim material (the interior of the D) lies on the opposite side of the position of the straight edge of the D-shape. This reversal of the orientation of the D-shape may be achieved by simply reflecting the D-shape about the line coinciding with its straight edge. Other options are depicted in FIG. 3. In FIG. 3A, D-shaped patterns that all have their outer curved edge lying along the same sized circle. The upper two D-shaped patterns 110, 120 have their straight edges at different values of η. The bottom two D-shapes 130, 140 share the same magnitude of η as the upper shapes 110, 120, but the interior of the D-shapes are situated on the other side of the position of the straight edge. The bottom two patterns would correspond to the "negative η" versions of the top two patterns. The four D-shapes depicted in FIG. 3A, together with all the versions of these four shapes oriented in the eight directions depicted in FIG. 3B, are but one illustrative example of a set of extended basic passive shim elements useful for shimming a magnet. In this particular case, there are 64 members of the set, with 32 to be used on one side of the working volume (e.g. 14) and 32 to be used on the other side (e.g. 16).

It is unlikely that the magnetic field to be corrected has an error that corresponds exactly to one of the passive shim patterns in the chosen set. Instead, it is more likely that the field correction required corresponds to the sum of a fractional strength contribution from each member of the set of passive shim patterns. The passive shim technologies disclosed herein, for example the use of printed magnetic ink, are particularly well-suited to producing this combination of fractional patterns. The amount of ink printed to make any one pattern may be scaled at all positions in the passive shim pattern, so that a fraction of the total pattern may be readily constructed. Similarly, the combination of fractional patterns may be readily constructed by printing first the fractional version of one pattern, then the fractional version of another pattern, and so on until the entire combination is constructed in one overall corrective passive shim structure. The overall shim structure, therefore, is composed of a combination of basic passive shim elements of fractional strength. The build-up of patterns may also be handled within the process used to drive the printer, so that two or more of the fractional layers may be built up at the same time. It may be possible to print the entire combination of fractional patterns simultaneously.

For cases where stronger correction is required, the pattern build-up process may be implemented to create multiples of the fundamental patterns; in such a case, the fractional pattern may be thought of as having a fractional contribution larger than 1.0. A similar conceptual framework of building up fractional patterns may be implemented for other passive shim construction methods, such as the build-up of shim stock layers, the modification of solid materials by etching or milling or drilling to produce an overall pattern whose dipole moment density corresponds to the combination of fractional contributions of the basic shim patterns.

Linear combination of fundamental structures is a common feature in many examples of the design process of the present disclosure. The fundamental structures will be referred to as basic passive shim patterns. These may or may not be designed to produce magnetic fields described by mathematical functions that are elements of a set of functions, referred to as a basis set. The sets of basic passive shim patterns that have corresponding mathematical basis set functions may be labeled or called by their mathematical function (e.g., X, $Y^3Z-Z^3Y$, XY, etc.), as is common in the art. Any of these set elements (basic passive shim patterns or mathematical basis set functions) may be referred to as "terms," and generally will have a well-defined mathematical "order," as is understood in this art. Linear combinations of basic passive shim patterns may be constructed so as to form a full corrective shim pattern. The coefficients in such a linear combination may be derived using the mathematical basis set, or by other means. Techniques from linear algebra may be used advantageously in designing appropriate linear combinations. One set of basic passive shim patterns may be combined in various ways to produce a new or alternative set of basic passive shim patterns, which may be used in place of or in conjunction with the original set of basic passive shim patterns.

The determination of the proper fractional contributions of each of the basic passive shim patterns needed to correct a magnetic field may be carried out in a number of ways. For example, the magnetic field to be corrected may be measured at a collection of points in or near the intended working volume of the magnet. This set of measurements of field as a function of position in space is referred to as a "field map." While it is not a requirement of the presently disclosed systems and methods to map the magnetic fields of the passive shim patterns, it may be helpful to do so. Field mapping may be achieved using a Hall-Effect probe or other magnetic field measurement device to measure the magnetic field at different point in space throughout the region of interest. The placement of the probe may be controlled by an XYZ stage. If this stage is motorized and under computer control, the process can be automated. It may be useful to use a Hall-Effect probe capable of high field resolution, as high as 1 ppm or more in the fields being measured. The preferred field measurement technology is Nuclear Magnetic Resonance (NMR), using a small microcoil and sample, as described in U.S. Pat. No. 7,405,567 to McDowell, for example. The microcoil probe may be mounted on the computerized XYZ stage described above. The NMR frequency detected can be converted to the field at the location of the NMR sample, using methods well known in the art.

There are other methods for mapping the magnetic fields that are useful for the present invention. Gradient mapping methods, for example those based on techniques from Magnetic Resonance Imaging (MRI), may be used. Such techniques may be based on phase encoded imaging, on the method known as FASTMAP, or other MRI or pulsed field gradient based methods. Such mapping methods would be highly suitable for mapping the field distortions within the probe that will be used to perform NMR or MRI, for example. Using gradient mapping, the passive shimming technology could be used to shim the effects of the probe itself, in addition to shimming the magnet.

The field map of the magnet to be corrected may be analyzed to yield the fractional contribution of each of the basic passive shim patterns. For example, it may be analyzed mathematically to reveal the maps content in terms of a basis set of mathematical functions. Alternatively, the basic passive shim patterns made in the manner described above may themselves be mapped at the same set of points as that used to map the field to be corrected. For example, the unique D-shapes chosen for use in correcting a magnetic field (that is, the D-shapes corresponding to the choices of η to include, and including the negative values of η), may be mapped individually. The field maps for the other orientations deemed necessary to correct a magnetic field, such as the orientations depicted in FIG. 3B, may be acquired by remounting the D-shapes in those other orientations and on each pole of the magnet, or these other maps may be generated mathematically from the first set of maps. The full set of D-shape maps may then be used to decompose the map of the field to be corrected, resulting in a set of coefficients describing the contributions of each D-shape to the optimal corrective structure.

To map the field produced by a particular passive shim pattern, it is advantageous to proceed by mapping the field in a magnet without the shim present, then mount the shim into its working position and map the resulting field. The map of the field due to the shim alone is found by subtracting the two maps. This approach allows the use of NMR to measure the weak field increment due to the shim pattern. It also is noted that the passive shim may not produce a field unless it is placed into a magnetic field strong enough to magnetize the shim. This is true for example, for shims made with low carbon steel or other soft magnetic material.

Taking the difference between two maps requires a reproducible mounting apparatus and method, which is a basic requirement of high performance passive shimming. The preferred method is to map the field of the magnet (the background field), then mount the shim in the magnet and map the resulting total field, then demount the shim and remap the magnet (a second background field). The two background maps can be compared to determine the stability or reproducibility of the mapping process. Alternatively, it may be possible to arrange the shim pattern to be mapped in such a way that it can be removed from the magnet without disturbing any other magnetic structures. Then maps can be made before and after removing the shims, and a difference of these maps gives the field due to the shim alone. It may also be possible to remove the shim from the magnet by dissolving the shim and/or its substrate using a solvent, to deactivate the shim using heat, or some other method for effectively removing the shim from the magnet.

Maps of the fields created by the full-strength versions of all the basic passive shim patterns may be made. Then the process of finding the fractional contribution of each pattern may be carried out by finding the linear combination of the maps of the basic passive shim patterns that does the best job of compensating the errors in the map of the field of the magnet to be corrected. The combination of basic passive shim pattern contributions may be found by utilizing standard software optimization tools, such as linear programming methods, least squares fitting, non-linear fitting, or "solving" such as via the solver function in Microsoft® EXCEL. Points may be weighted in order to affect the fit, for example by accentuating certain regions, or certain basis set functions, which may be helpful in cases where the data quality (signal-to-noise ratio in the field maps) differs from location to location or from map to map. Methods such a singular value decomposition which give information regarding the impact of each individual term of the linear combination may be used to cull the resulting linear combination of contributions that are trivially impactful, or are ill-defined due to noise in the measurements, or that are in other ways good candidates for exclusion from the linear combination.

The method used to determine the combination of basic passive shim elements may or may not include a constraint on the amounts of passive shim material to be used in the full corrective structure. The passive shims disclosed herein may be constructed so easily that there may be no benefit to including a constraint on the total amount of passive shim material to incorporate in the passive shims to be constructed.

It is likely to be advantageous to use a number of map locations that exceeds the number of basis set patterns to be combined. For example, it may be useful to map at roughly twice the locations that the number of basis set patterns to be used.

The linear combination coefficients can be used to formulate a passive shim correction pattern that contains all of the necessary components to achieve the desired magnetic field correction. One simple method is to construct the required basic passive shim patterns in the form of a matrix of shim intensity values, then form the total matrix of numbers that is the linear combination of the basic pattern matrices using the set of linear combination coefficients found in the solving step. The total passive shim correction can be constructed to match this total matrix, for example, by using the matrix to control the deposition of passive shim material in each area on the passive shim structure. It may be advantageous to formulate the total passive shim correction structure without resorting to calculating such matrices, for example, if computer or controller memory is limited, or if very high resolution passive shim structures are desired. Methods that rely on continuous mathematical functions to control the shim production, rather than discretized matrices, may prove to be advantageous in such or similar circumstances.

It may be advantageous to use the first set of basic passive shim elements and then combine them in a correct proportion to create other sets of basic passive shim elements or patterns. Such derived sets of passive shim correction patterns may be easier to use in determining and constructing the overall passive shim correction for a particular magnetic field. One example of such an advantageous derived set of basic passive shim patterns is the set that produces fields described mathematically by the real-valued spherical harmonic (RVSH) functions, which are well known in the art. For example, for each RVSH function, the linear combination of D-shaped patterns needed to create that function may be determined using the same techniques described above for correcting a measured magnetic field. The resulting passive shim patterns will be built up of fractional layers of D-shapes of constant dipole moment density, oriented in various directions. The resulting patterns, intended to create each RVSH function individually, may be mapped in the manner described above. If deemed advantageous, the process may be iterated to improve the quality of the RVSH patterns so that they produce mathematically pure fields. These RVSH maps can then form the foundation for correcting the magnetic field, by finding the linear combination of the RVSH patterns that correct the field as desired.

Under certain circumstances, for example limitations of construction or analysis tools, it may be advantageous to first correct a magnetic field using the D-shape maps directly, and then make further corrections using harmonics term patterns derived from the D-shape fields. Other variations of such a multi-phase correction protocol may be employed.

The RVSH functions have many useful mathematical properties, such as spanning the mathematical space of functions describing magnetic field errors, orthogonality, etc., and there are many tools for analysis and manipulation of the RVSH functions that are known in the art. However, other mathematical basis sets, such as those based on sines and cosines, are also known in the art. The basis sets are typically organized in terms of their polynomial degree: first order terms are functions that contain a single power of a coordinate (e.g., X, or Y, or Z), while second order terms are functions that contain two powers of the coordinates (e.g., $X^2$, $XZ$, $2Z^2-Y^2-X^2$) and so on. The mathematical basis set is most useful if it mathematically spans the space of possible desired field corrections. It is additionally useful for the mathematical basis set to be orthogonal.

D-shape shim patterns may be of particular utility under conditions where shims made from solid materials, such as shim or plate stock, are useful or needed to make strong corrective fields. In this case, only a small set of unique D-shapes needs to be fabricated; for example, a set containing only four D-shapes shown in FIG. 3A. Since these can be mounted in any orientation, such a small set is capable of correcting many different field errors. The solid D-shapes may be constructed with positioning tabs or holes and may be mounted on a structure with indexing elements, such as recesses or dowel pins, which may be able to hold the D-shapes in a plurality of useful orientations.

Figure 3C:
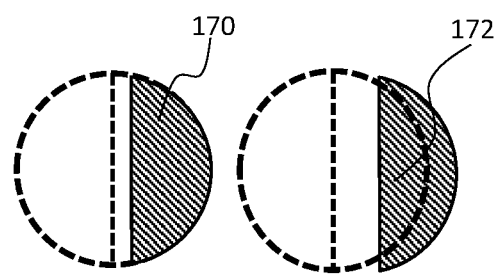
FIG. 3C illustrates another alternative embodiment of the present system and method, relating to the embodiments of FIGS. 3A and 3B, but depicting two elements with D-shapes with different η values, achieved by shifting one of the D-shapes so the two pattern shapes no longer share the same circle as their outer curved edge.
Figure 3D:
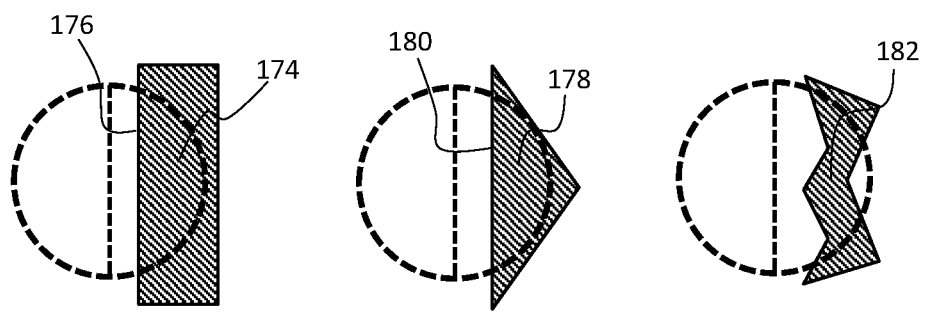
FIG. 3D illustrates another alternative embodiment of the present system and method, with alternative rectangular and triangular shim pattern shapes; these shapes retain a straight inner edge near to η=0, but also showing an irregular, erratic, general shape or form which retains a large lateral extension but has a complicated outline.

Only D-shapes that share a common outer circular edge have been discussed herein in detail. Other versions of the D-shape, and indeed other shim pattern shapes entirely, may also be used in the presently disclosed systems and methods. An alternative example is depicted in FIG. 3C, where two D-shapes 170, 172 are shown with different η values, achieved by simply shifting one of the D-shapes so the two pattern shapes no longer share the same circle as their outer curved edge. Further alternative shapes are provided in FIG. 3D, where rectangular 174 and triangular 178 shim pattern shapes are shown. These shapes still retain the straight inner edge 176, 180 near to η=0. FIG. 3D also shows an irregular, erratic, general shape or form 182, which retains the large lateral extension of the other pattern shapes, but has a complicated outline. Such a general form may or may not be defined with straight edges. While the mathematical analysis of this or any other irregular shape would be expected to be difficult, such complicated geometrical shapes may have particular magnetic properties that warrant their use.

A set of shim pattern shapes used to correct a magnet need not all be D-shapes, or all rectangles, etc. A combination of various shapes may be used to correct a magnet.

Production of the passive shim structures, either the full corrective structure or the structures corresponding to the basic passive shim patterns (e.g., those corresponding to the D-shapes or the RVSH functions) may proceed in a number of ways. One particularly powerful construction method is the use of magnetic ink. In this case, the dipole moment density can be thought of as a gray-scale image, and this image can be printed using magnetic ink in an otherwise standard printer. For most graphics rendering programs, the gray scale is optimized such that the steps of the gray scale give the visual impression of uniform steps in image intensity. The amount of ink printed to render these steps of image intensity may be far from uniform; in other words, the volume of ink printed in any one pixel of an image will not be linearly related to the gray scale value. The gray scale values can be calibrated in terms of printed ink density. This will allow the printing of a pattern whose ink density corresponds to the optimized current values.

Figure 4:
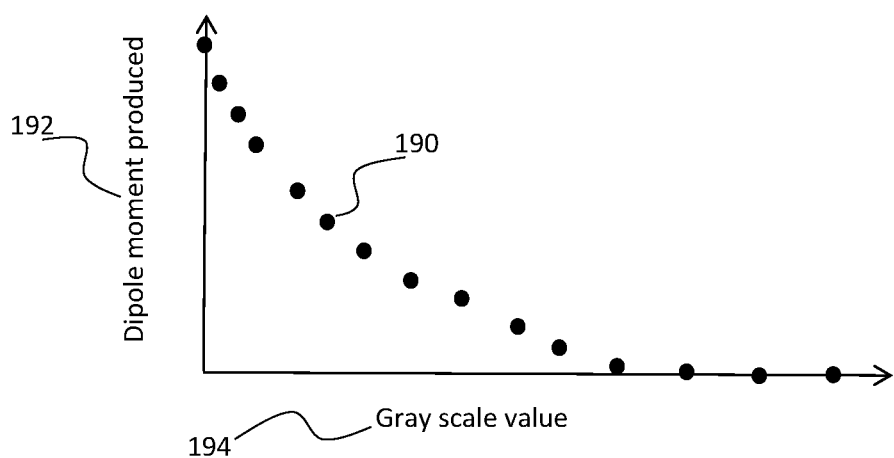
FIG. 4 is a graph illustrating measuring a magnetic field produced by shim patterns printed with different gray scale values, whereby it is possible to determine the calibration of the gray scale with respect to the magnetic dipole moment density of the ink deposited; the plot of FIG. 4 is an example of such measurements where the dots plot measurements of the dipole moment produced versus the gray scale value used.

To determine the gray scale calibration, it is useful to print test patterns that contain only regions of a single fixed gray scale intensity and other regions that are devoid of ink entirely. A particularly useful calibration pattern is an annular disk of ink with a blank hole in the middle. Two such disks, with appropriate inner and our diameters (see, for example, the active shim publication of Anderson, *Review of Scientific Instruments*, vol. 31, pp. 241-250, 1961) and placed one on each pole of the magnet, produce the $Z^2$ field that can be mapped and readily interpreted. By measuring the field produced by such patterns printed with different gray scale values, it is possible to determine the calibration of the gray scale with respect to the magnetic dipole moment density of the ink deposited. An example of a plot of such measurements is shown in FIG. 4, where the dots 190 plot measurements of the dipole moment produced 192 versus the gray scale value used 194.

The calibrated gray scale is useful for producing the desired passive shims using a straight forward printing process on standard printers, such as ink-jet or laser printers. Passive shim patterns may also be made with layers of magnetic material, such as shims stock, foil, or tape. These layers may be cut and built up in such a way as to achieve the desired dipole moment density distribution. Alternatively, selective etching or machining may be used to pattern an initially solid piece of magnetic material by cutting it and/or thinning it in such a way as to achieve the required dipole moment distribution. For example, small holes may be cut in the material to produce bands or regions that have different amounts of remaining material, so that in effect bands or regions of constant magnet dipole moment density are created when installed in the magnetic field. Any of these or similar methods may be used with a calibration step so that the strength of the magnet fields that will be produced may be known in advance and the correct number of layers or thicknesses may be produced.

Once printed or otherwise produced, the passive shim structure can be mounted in the magnet. In the case of magnetic ink printed onto paper or a similar thin substrate, the shims may be mounted into place by carefully positioning them using any of a number of means, such as dowel pins, indexing edges or points, fiduciary marks, or mechanical positioning systems.

It may be useful to refine the pattern used to produce a particular one of the basic passive shim patterns. The refinements may improve the purity of the field produced by reducing the size of the undesired fields produced as "impurities." For example, in using ink to produce basic passive shim patterns related to the RVSH functions, errors in the gray scale calibration will lead to the presence of some of the undesired but symmetry-allowed field components. There may also be printer errors, errors in positioning of the passive shims, or other sources that give rise to larger than acceptable impurity fields. The largest impurity fields are often in the form of one or more of the fields that share the same fundamental Y- and Z-symmetry as the desired field. Hence, once the patterns for all of these fields are determined, made, and measured, the resulting field maps can be combined in such a way as to eliminate or reduce the impurities. By adding or removing the appropriate amount of dipole moment density (e.g., by changing the matrix values for gray scale ink printing), the pattern for any individual basis set function can be refined to be more pure.

Once the pattern for a basis set term has been refined, it can be produced and mapped in a manner that will be helpful in correcting this term in a future magnet. It may also be useful to analyze the map of the refined pattern for harmonic content.

The final patterns produced, for example using the RVSH functions, will not extend to infinity but will have an outer edge. The outer edge location will be constrained by the magnet structure. It may be advantageous to produce patterns with a large lateral extent, such as patterns whose outer edge is defined by the largest circle that fits in the magnet. Other choices are also possible, such as a pattern size and shape that facilitates the production, mounting, or installation of the passive shims in the magnetic field.

When seeking to achieve a high degree of magnetic field correction, it may be valuable to map the initially corrected field to confirm that the desired correction has been achieved. There may be residual errors, which can come from imperfections in the calculations, maps, mathematical approximations, truncations of linear expansions, construction, material, assembly or other sources. It may be advantageous to undertake one or more iterations of the shim design process. The residual field can itself be decomposed into contributions of the individual basic passive shim pattern maps. A new or additional correction can be calculated to correct the residual field. The additional correction may be implemented by constructing an additional passive shim structure, which is mounted in the magnet while the initial total correction is also mounted in the magnet. It may be advantageous that the initial correction structure remain in the magnet without being disturbed. An alternative is to construct an entirely new passive shim structure that is mounted in place of the initial structure. This may be preferred if space for mounting the passive shims is limited, if mounting more than one correction is difficult for other reasons, or for aesthetic reasons. It may also be possible to remove the initial shim structure from the magnet, add or remove material to it to achieve a better correction, and reinstall the shim structure in the magnetic field.

Whichever method is employed to design the total correction passive shim structure, the passive technology of the present disclosure retains important advantageous features when compared to previous technology. The use of large-scale, extended patterns reduces or eliminates the production of high-order impurity fields, which pose a challenge and limitation for traditional passive shimming technologies. The basic passive shim patterns may be constructed so that they each individually avoid the production of higher order field components, which will in turn endow any linear combination of these patterns with the same feature of avoidance of high order field errors. The passive shimming technology disclosed here also works best when the shim material can be formed or deposited in a nearly continuous manner, such as with an ink-jet printer. This allows all possible linear combinations of basic passive shim patterns to be realized in the total correction shim; that is, the continuous-value linear coefficients derived from the solving process can be implemented in the production of the total shim, without substantial or deleterious truncation due to a limitation to a discrete set of values. The latter are typical limitations of traditional passive shimming with buttons.

Another advantage of the passive shim technology of the present disclosure is that it may be produced in such a way that the total shim, including the substrate on which it is constructed, is very thin. It may be less than 0.5 millimeters thick, or in many cases substantially thinner. Traditional passive shimming with buttons, being discrete pieces of material that are handled individually, typically requires more space.

In some cases, for example, in the case where very strong corrections are required, it may be advantageous to combine the more continuous passive shim design and production described above with less continuous, e.g. discontinuous, shim production methods. For example, it is possible to shape solid, extended pieces of magnetically active material in such a way that they produce magnetic fields whose harmonic content is dominated by a single mathematical term, or small set of terms. Often this is the low order term or terms. Extended materials such as shim stock, foil, tape, or sheet stock may be so formed. The shape to be formed may be taken from the work of Anderson on active, current carrying shims, for example, although other shapes and resulting fields may be used. Design methods such as those described above for use with continuous shim materials may be modified for use with discontinuous materials.

These discontinuous passive shims have the advantage that they may be stronger than those shims produced using continuous materials and methods, so that larger error fields may be corrected. The discontinuous shims described here have the advantage over traditional passive shimming with buttons in that the extended form of the shims described here largely avoids the production of higher order error fields. To some extent, the strength of discontinuous shims described here may be adjustable or selectable, but in a manner that provides control of the shim field strength that is less continuous than the continuously adjustable shim materials and methods described above. Some discontinuous adjustments include: the selection of shim or sheet stock thickness from a small number of thickness options, the specifications of an integer number of layers of foil material, etc. It may be acceptable to use extended shapes of discontinuous passive shim materials that only approximate the desired shapes of the strong corrections; subsequent shimming with a continuous-valued material may be used to correct the errors so introduced. By stacking up a number of different discontinuous shim layers, it may be possible to provide a total correction shim that has, in effect, a number of different thicknesses at different locations in the shim. Such a stack of different patterns may be useful to correct a large proportion of the field error, particularly for errors corresponding to the lower mathematical orders.

The discontinuous shims described above may be used very effectively in conjunction with the continuous passive shim materials and methods that are a subject of this patent application. The discontinuous shims may be able to correct a large fraction, and maybe even most, of the error. But due to the inability to finely adjust the strength of the discontinuous shims, the residual field may not be reduced sufficiently. The residual field can then be treated at the field to be corrected by the continuous shim methods. The resulting passive shim structure may then contain passive shim elements made from both continuous and discontinuous materials. Alternatively, but less frequently, the resulting passive shim structure may contain some selected passive shim elements made exclusively from the discontinuous material and other selected passive shim elements made solely from a continuous material.

The continuous passive shims that are the subject of this disclosure may be installed in magnets using the following methods, or other methods that achieve the required levels of positional accuracy. Methods may be preferred on the basis of the level of accuracy and reproducibility they provide, the costs they require, the degree to which they are generally applicable to various magnet designs, and the space available in the final magnet configuration for items needed to locate the installed shims accurately, such a screws or pins.

It may be useful to create fiduciary marks on the structure to which the passive shims will be mounted. These fiduciaries may need to be produced on two sides of an opaque structure, for separate mountings of the shim structure for either of the two magnet poles. The fiduciaries may be created on a milling machine in which the mounting structure can be reproducibly mounted. The marks may alternatively be made on a special-purpose printer with a printing bed capable of high-accuracy placement of the material to be printed on.

The passive shim pattern that will correct the magnet field errors can be calculated and produced by methods described above. The patterns may be created with fiduciary marks designed so that, if these marks were to be mounted in such a manner so that the fiduciary marks on the patterns aligned with the marks on the mounting structure, the patterns would be accurately positioned. The pattern's marks may be made, for example, by the same printer that prints the pattern itself, either by printing a non-magnetic material, or printing a magnetic material with negligible magnetic intensity (e.g., a very light gray scale value). If other mechanical, chemical, laser-based, or other methods are used to produce the passive shim pattern, these methods can also be extended to create the necessary fiduciary marks for alignment of the shims upon installation.

The passive shims may be produced on a standard ink-jet printer. It may be necessary to print onto the same sheet of paper multiple times, in which case it may be necessary to carefully control the positioning of the paper in the printer so that the overprinted layers line up sufficiently. A specially designed printer, with a printer bed and paper management system arranged so that the paper position can be very accurately controlled, may be advantageous for the production of passive shim patterns. Customized software for the control of the printing process may be utilized, so that larger quantities of ink can be printed on a single pass through the printer, eliminating the need for overprinting and alignment. A printer may be equipped with methods for mechanically locating the substrates to be printed on to a high degree of precision. For example, a reusable sheet with fiduciary marks may be used by positioning a piece of shim substrate on the sheet and affixing the substrate with non-permanent adhesive. This reusable sheet, bearing the substrate, may be passed through the printer. The reusable sheet may be a heavy duty paper or plastic sheet, for example. The shim substrate may be a piece of paper. Using this approach, and previously printed shim patterns may be replaced onto the printer sheet for overprinting. The shim substrate may be attached to the reusable printer sheet using non-permanent adhesive, such as standard office tape. Another approach is to provide a printer guide sheet with pins, or edges, or mechanical stops that can be used to position the shim substrate to a high degree of accuracy.

Another approach is to build a custom printer with a printer bed for mounting the shim substrates, providing this bed with fiduciary marks or mechanical stops as described above, for accurate positioning of passive shim substrates. The shim substrates can be demounted from the magnet and mounted onto the printer bed for further printing of iterative corrections, new corrections, etc. Using fiduciary marks or mechanical stops, the newly printed shim substrate may be remounted into the magnet into substantially the same location.

A custom printer may also be built to allow the deposition of the shim material directly onto physical structures that will be mounted in the magnet, such as the signal detection probe, the active shims, a thermal control element, or any other structure with a surface onto which the shim material may be deposited. The structure may have indexing holes, pins, tabs, mechanical stops, fiduciary marks or other mechanisms to ensure that it is positioned on the bed of the passive shim production device in a reproducible manner. These indexing or registration elements may also ensure that the deposition onto the two sides of the structure is done so that the patterns on the two sides of the gap are positioned coaxially, or in any other sense of alignment required by the passive shim design.

Shim patterns may also be constructed to be self-supporting and may require no substrate. In this case, they may be given their own markings or other features to facilitate correctly aligned installation in the magnet.

The discussion has focused on the mounting of shims near the poles of a dipolar magnet geometry. Similar approaches of alignment of printer with respect to shim substrate, shim substrate to shim mounting structure, and other alignment tasks may be applied to shim designs intended to be mounted elsewhere in the magnet gap of dipolar magnets. Similar techniques may also be employed for the mounting of the herein disclosed passive shim devices in cylindrical magnets, both of the Halbach and of the superconducting geometry. In these cases, the shim substrate and/or the shim mounting structures may be planar in overall shape, or they may be cylindrical.

Iteration may be useful to overcome limitations in the design, construction, or mounting procedures used in implementing the passive shim technology disclosed here. Iteration is a particular strength of the disclosed technology, due to the near-continuous nature of the shim strength that can be implemented. A number of iteration methods can be implemented. A simple method is to take measurements and produce a new correction pattern for further improvement to a magnetic field, and simply mount this pattern in addition to any existing correction patterns already implemented. It may be beneficial to implement this approach in a manner that allows the existing corrections patterns to remain in the magnet, undisturbed by the iteration process. Another approach is to make the measurements of the residual field, demount some or all of the existing correction patterns and mount them, in turn, on the printer so that they may be overprinted with the calculated additional material called for by the iteration calculations. The overprinted patterns can then be remounted in the magnet. Another approach is to measure the residual field and calculate the additional material needed to further correct the magnet, demount the existing correction patterns from the magnet, calculate a new single pattern that incorporates the existing patterns together with the additional iteration patterns, produce this total pattern in a new shim pattern and mount this, by itself, into the magnet.

In cases where it is possible to print directly onto the shim mounting structure without needing to print first onto a shim substrate and then mount the substrate onto the structure, other iteration possibilities exist. For example, the residual field of the existing corrections may be measured with the existing patterns mounting in the magnet on the shim mounting structure. The map of the residual field may be analyzed to determine the additional pattern that would further improve the magnet. The shim mounting structure may be removed from the magnet and mounted so that it can be printed upon. The new pattern of passive shim material can be added to the shim mounting structure directly, and the shim mounting structure can be remounted in the magnet. The shim mounting structure so used may be a second structure that serves another purpose, such as the NMR probe body, active shim structures, or similar parts of an apparatus. Thus the overall shim structure may include a second structure, having a complementary purpose other than shim mounting, to which the combination of basic passive shim elements is attached.

The passive shimming technologies disclosed here may be readily combined with active shimming methods and structures. These active shimming methods may be traditional one-coil-per-mathematical-term style shims, or more modern methods such as matrix shims. Most advantageously, the active shims may be the straight wire shims described in U.S. Pat. No. 9,285,441 to McDowell, which can be made to be very thin, hence preserving limited space inside a magnet. The advantage is significantly enhanced if the passive shim patterns can be created using the active shim structure as the substrate and mounting structure.

Other design methods for the determination of the passive shim patterns may be employed. Target field methods, for example, or other methods used for the design of active shim coils or traditional button shims. In some cases, these other methods contain a step in which a dipole moment distribution on a surface or throughout a volume is calculated, and then in a subsequent step the distribution of electrical currents to produce this dipole moment distribution is calculated. For the use in designing shims of the present disclosure, the dipole moment distribution may be used directly to specify the spatially extended and contiguous pattern of passive shim material that should be created.

Other basic passive shim patterns may be implemented, as an alternative to the D-shapes described in detail above. Curved bands, grids, or other extended patterns may be used. Single bands, or a collection of bands, may be treated as the basis set. Non-planar bands or structure may be used, for example, in an implementation of the technology utilizing 3D printing to produce the shim patterns. The shim patterns, including the basic passive shim patterns, may be curved planes, or they may be fully 3D structures that extend into some regions of the magnet gap away from the region nearest the pole pieces. The set of basic patterns may be heterogeneous in that is may contain shapes of a variety of morphologies (square, circular, triangular, etc.).

The analysis of the field maps of the patterns and of the magnet to be corrected may be carried out in terms of harmonic content, or in terms of other sets of mathematical functions, using techniques well-known in the art. Harmonic content is easiest to calculate for spherical maps. The advantage of using a decomposition into mathematical functions is that all of the maps used in the optimization step of the design process need not be taken at the same locations in space. Maps taken over one set of points may be mathematically extended to a second set of points using the mathematical decomposition and the reconstitution at the desired "map" locations. Alternatively, the optimization step to determine the correction pattern can take place entirely by considering the harmonics (or other) content of the basis set patterns and the map to be corrected. This way, an optimization for a different region of space may be carried out without needing to remap all the basis set patterns. A second advantage of using the decompositions for optimization is that the decomposition components may be restricted to only a subset to be included in the optimization.

The methods herein described may require that there be a sufficiently large background field, such as when soft magnetic materials are used. Such materials require a minimum magnetic field to become magnetized, and thereafter they create the correction fields. The minimum field will depend on the material chosen for the passive shim construction. The minimum field may be 1.0 Tesla, 0.5 Tesla, 0.1 Tesla or whichever value the material requires. The passive shim material may be used in circumstances where it is only partially magnetized, for example magnetic ink or steel in a field of 0.2 Tesla or below. Under these conditions, it may be required to take the non-saturation of the magnetization into account during the design process. Alternatively, iteration methods may account for the non-ideal magnetization behavior and eliminate the need for sophisticated accounting for the non-saturation behavior.

When finding an overall corrective passive shim pattern, the solving processes discussed above, used to produce the linear combination needed to correct the magnetic field, are applied to maps of the field values of the basic passive shim patterns and the magnetic field to be corrected. The linear combination may be determined in other ways. For example the maps of the individual basic passive shim patterns and the magnetic field to be corrected may be decomposed into their spherical harmonic content, yielding a set of numbers that characterize the various spherical harmonic components of each field. Other analytical decompositions are also possible, including Bessel functions, Fourier components based on sines and cosines, or other sets of functions useful for mathematical analysis. The difference between the desired field and the magnetic field to be corrected may also be expressed in the same mathematical decomposition, yielding a set of numbers that characterizes the field that needs to be made through linear combination. Now the solving or optimization process can be applied to these new sets of numbers, rather than the field map points themselves, to find the optimal linear combination of basic passive shim patterns to achieve the desired correction. The advantage of such an approach may be that fewer numbers must be considered in the optimization step. Also, the sets of decomposition coefficients may have mathematically advantageous properties, such as orthogonality, that improve the solving process. Furthermore, the correction may be limited to certain field components, or certain components may be preferentially optimized. This may be appropriate in a magnet system that will contain both passive and active shims, where the active shims may be used to adjust the correction for some orders but not others. In a typical case, the active shim system will be limited to corrections of low order field errors. On the other hand, the passive shim technology discussed here is in principle capable of correcting errors at arbitrarily high mathematical order.

As another alternative to the design process described above, the field maps of the basic passive shim patterns may be calculated or simulated, rather than directly measured. This may provide enough accuracy and allow the elimination of the requirement that all basic passive shim patterns be mapped via measurement. The procedure for designing the total correction pattern is unchanged whether calculated or measured basic passive shim pattern maps are used. Iteration of the correction may be used to account for errors in the field calculation.

Any and all of the above describe methods for correcting magnets may proceed in a simplified form if the magnet to be corrected is the next magnet of a set of similar magnets, such as during the production of a number of magnets of the same design. In such cases, it may be possible to eliminate the step of measuring the fields of all basic passive shim patterns in each new magnet. Instead, the field maps for the basic patterns measured using a representative magnet, which may be the first magnet, can be used in the process for correcting the next magnet. Any differences in the quality of the corrected field which may be due to the fact that the passive shim patterns may perform slightly differently in the next magnet may be accounted for via the iteration methods, or by other means.

Although the invention has been described in detail with particular reference to these preferred embodiments, other embodiments can achieve the same results. In the previous description, specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known principles of mathematics and physics have not been described in detail, in order not to unnecessarily obscure the present invention.

Only some embodiments of the invention and but a few examples of its versatility are described in the present disclosure. It is understood that the invention is capable of use in various other combinations and is capable of changes or modifications within the scope of the inventive concept as expressed herein. Modifications of the invention will be obvious to those skilled in the art, and it is intended to cover in the appended claims all such modifications and equivalents. The entire specifications of all patents cited hereinabove are hereby incorporated by reference.

What is claimed is:

1. An apparatus for correcting the magnetic field of a magnet, the field in a working volume of space, the apparatus comprising:
a shim structure, located in a planar region, that produces a second magnetic field for correcting the magnetic field, the shim structure comprising a combination of spatially extended basic passive shim elements; the basic passive shim elements being equal to or greater in size than the working volume, wherein a size of the working volume is representable by a circle indicating the extent of the working volume projected into the planar region, and wherein at least one of the basic passive shim elements comprises:
an inner edge traversing the circle indicating the extent of the working volume, so that at least a portion of the inner edge is within the circle; and
remaining edges located outside the circle indicating the extent of the working volume; and
wherein the combination of basic passive shim elements defines a shim structure having a plurality of broad, contiguous regions of piece-wise constant, non-zero dipole moment density.

2. The apparatus of claim 1 wherein the at least one of the basic passive shim elements comprises a material that creates a dipole moment density having a strength value selected from a near-continuous set of values.

3. The apparatus of claim 1 wherein the at least one of the basic passive shim elements comprises magnetic ink.

4. The apparatus of claim 1 wherein the shim structure comprises a combination of basic passive shim elements of fractional strength.

5. The apparatus of claim 1 wherein the at least one of the basic passive shim elements defines a D shape having a straight inner edge.

6. The apparatus of claim 5 comprising at least two solid D shapes indexed into orientational position.

7. The apparatus of claim 1 wherein at least one of the basic passive shim elements defines a general form with or without straight edges.

8. The apparatus of claim 1 wherein the basic passive shim elements comprise a material that creates a dipole moment density having a strength value selected from a discontinuous set of values.

9. The apparatus of claim 1 in which the basic passive shim elements comprise a combination of a material that creates a dipole moment density having a strength value selected from a discontinuous set of values, and a material that creates a dipole moment density having a strength value selected from a nearly-continuous set of values.

10. The apparatus of claim 1 wherein the at least one of the basic passive shim elements comprises a soft magnetic material.

11. The apparatus of claim 1 wherein the at least one of the basic passive shim elements comprises one or more layers comprising a two dimensional foil, tape, or sheet.

12. The apparatus of claim 1 wherein a first set of basic passive shim elements is combined to create a second set of basic passive shim elements whose linear extent is larger than a radius of the circle indicating the extent of the working volume projected into the planar region.

13. The apparatus of claim 1 wherein the basic passive shim elements are fabricated by a 3D printing process using a polymer or powder matrix comprising a material that produces a magnetic dipole moment density.

14. The apparatus of claim 1 wherein the combination of spatially extended basic passive shim elements comprises a structure of thickness less than one-half millimeter.

15. The apparatus of claim 1 wherein the shim structure comprises the basic passive shim elements and a mounting structure.

16. The apparatus of claim 1 wherein the shim structure comprises a second structure having a purpose other than shim mounting structure, to which the combination of basic passive shim elements is attached.

17. The apparatus of claim 1 wherein the combination of basic passive shim elements comprises a solid structure modified to achieve the dipole moment density distribution that corrects the magnetic field.

18. A method for providing a corrected magnetic field over a working volume of space, comprising:
   a) measuring an initial magnetic field strength at points in the working volume;
   b) selecting a planar region in which to locate a field correcting shim structure;
   c) defining a set of spatially extended basic passive shim elements being equal to or greater in size than the working volume, wherein a size of the working volume is representable by a circle indicating the extent of the working volume projected into the planar region;
   d) locating each basic passive shim element individually in the planar region such that at least a portion of a straight inner edge of the shim element is within the circle, and remaining edges of the shim element are outside the circle;
   e) determining a strength of the magnetic field of each basic passive shim element at points within the working volume;
   f) determining, using the field strength of each shim element, a combination of factional strengths of each of the basic passive shim elements that corrects the initial magnetic field strength in the working volume;
   g) constructing the field correcting shim structure as a passive shim structure that realizes the combination of fractional contributions, so that the passive shim structure has a plurality of broad, contiguous regions of piece-wise constant dipole moment density; and
   h) positioning within the planar region the passive shim structure to correct the initial magnetic field.

19. The method according to claim 18 wherein locating each basic passive shim element comprises collecting elements having D-shapes with a plurality of orientations and positions of their respective straight inner edges.

20. The method according to claim 18 wherein constructing the field correcting shim structure as a passive shim structure comprises constructing the basic passive shim elements from a material creating a dipole moment density that has a strength value selected from a nearly-continuous set of values.

21. The method according to claim 18 wherein constructing the field correcting shim structure as a passive shim structure comprises constructing the basic passive shim elements from magnetic ink.

22. The method according to claim 18 wherein constructing the field correcting shim structure as a passive shim structure comprises simultaneously constructing a plurality of fractional basic passive shim elements.

23. The method according to claim 18 wherein constructing the field correcting shim structure as a passive shim structure comprises constructing by an additive manufacturing process.

24. The method according to claim 23 wherein constructing by an additive manufacturing process comprises constructing the passive shim structure by a 3D printing process using a polymer or powder matrix containing a material producing a magnetic dipole moment density.

25. The method according to claim 18 wherein constructing the field correcting shim structure as a passive shim structure comprises constructing the basic passive shim elements from a material creating a dipole moment density having a strength value selected from a discontinuous set of values.

26. The method according to claim 18 wherein constructing the field correcting shim structure as a passive shim structure comprises combining a material creating a dipole moment density having a strength value selected from a discontinuous set of values and a material creating a dipole moment density having a strength value selected from a nearly-continuous set of values.

27. The method according to claim 18 wherein constructing the field correcting shim structure as a passive shim structure comprises constructing the passive shim structure using one or more layers of a two dimensional foil, tape, or sheet.

28. The method according to claim 18 wherein constructing the field correcting shim structure as a passive shim structure comprises constructing the shim structure in layers separately implementing fractional basic passive shim elements one at a time.

29. The method according to claim 18 wherein constructing the field correcting shim structure as a passive shim structure comprises building multiple fractional basic passive shim elements simultaneously.

30. The method according to claim 18 wherein constructing the field correcting shim structure as a passive shim structure comprises realizing the combination of fractional contributions in a single step.

31. The method according to claim 18 further comprising determining a strength of the magnetic field of all of the basic passive shim elements by measuring at points in the volume.

32. The method according to claim 18 further comprising determining a strength of the magnetic field of all of the basic passive shim elements by calculating the field at points in the volume.

33. The method according to claim 18 further comprising determining a strength of the magnetic field of the basic passive shim elements by measuring the field at the points in the volume for some of the shim elements and calculating the field of the remaining shim elements.

34. The method according to claim 18 wherein defining a set of spatially extended basic passive shim elements comprises collecting a set of shim elements having general shapes with or without straight edges.

35. The method according to claim 18 wherein steps c), e) and f) comprise the step of calculating a dipole moment density distribution that corrects the initial magnetic field in the volume, and step g) comprises constructing a spatially extended and contiguous passive shim structure that realizes the calculated dipole moment density.

36. The method according to claim 18 further comprising:
   a) combining a first set of basic passive shim elements to form a second set of extended shim elements;
   b) determining, at points in space within the working volume, a strength of the magnetic field of each extended shim element of the second set of extended shim elements; and
   c) determining, using the field strength of each extended shim element of the second set, a combination of fractional strengths of each of the extended shim elements of the second set that corrects the initial magnetic field strength in the working volume.

37. The method according to claim 36 wherein determining a combination of factional strengths comprises applying mathematical methods to measured magnetic fields of respective individual shim elements of the second set of extended shim elements.

38. The method according to claim 37 wherein applying mathematical methods to the measured magnetic fields of respective individual shim elements comprises a method selected from the group consisting of using least squares, or using linear programming.

39. The method according to claim 18 wherein constructing the field correcting shim structure as a passive shim structure comprises constructing a structure less than one-half millimeter thick.

40. The method according to claim 18 wherein defining a set of spatially extended basic passive shim elements comprises choosing a plurality of D shaped patterns that do not share a common outer curved edge.

41. The method according to claim 18 wherein constructing the field correcting shim structure as a passive shim structure comprises building a combination of basic passive shim elements directly onto a structure that has a secondary use in the magnetic field.

42. The method according to claim 18 wherein an amount of the passive shim material in the shim structure is unconstrained during a step of determining a combination of basic passive shim elements.

43. The method according to claim 18 further comprising improving a quality of the field correction by iteratively repeating steps a), g) and h).

44. The method according to claim 18 wherein constructing the field correcting shim structure as a passive shim structure comprises:
   a) building a combination of basic passive shim elements onto a substrate; and
   b) attaching the substrate onto a structure mountable to a magnet.

45. The method according to claim 44 further comprising producing the shim structure directly onto the structure mountable to a magnet, wherein the structure mountable to a magnet has a secondary purpose besides mounting the shim structure.

46. The method according to claim 18 wherein determining a combination of factional strengths of each of the basic passive shim elements that corrects the initial magnetic field strength in the working volume comprises:
   a) determining coefficients that characterize the harmonic content of the field of each of the basic shim elements;
   b) determining coefficients that characterize the correction to be made to the magnetic field; and
   c) finding a fractional combination of sets of coefficients of the basic shim elements that algebraically cancel the set of coefficients of the required correction.

* * * * *